(12) United States Patent
Ebigase et al.

(10) Patent No.: US 11,917,752 B2
(45) Date of Patent: Feb. 27, 2024

(54) BONDED SUBSTRATE AND MANUFACTURING METHOD OF BONDED SUBSTRATE

(71) Applicant: NGK INSULATORS, LTD., Nagoya (JP)

(72) Inventors: Takashi Ebigase, Nagoya (JP); Izumi Masuda, Kitanagoya (JP); Takeshi Kaku, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 303 days.

(21) Appl. No.: 17/494,891

(22) Filed: Oct. 6, 2021

(65) Prior Publication Data

US 2022/0030708 A1    Jan. 27, 2022

Related U.S. Application Data

(63) Continuation of application No. PCT/JP2020/014514, filed on Mar. 30, 2020.

(30) Foreign Application Priority Data

Apr. 9, 2019 (WO) ................. PCT/JP2019/015414

(51) Int. Cl.
*H05K 1/03* (2006.01)
*C04B 37/02* (2006.01)
(Continued)

(52) U.S. Cl.
CPC ......... *H05K 1/0306* (2013.01); *C04B 37/026* (2013.01); *H01L 23/15* (2013.01); *H01L 23/3735* (2013.01); *H05K 3/383* (2013.01)

(58) Field of Classification Search
None
See application file for complete search history.

(56) References Cited

U.S. PATENT DOCUMENTS 8,785,785 B2    7/2014 Kato
2014/0061929 A1*   3/2014 Inaba ................... H01L 21/768
                                                             438/642
(Continued)

FOREIGN PATENT DOCUMENTS

JP    2001-339155 A    12/2001
JP    2005-116813 A    4/2005
(Continued)

OTHER PUBLICATIONS

International Search Report of PCT/JP2020/014514 dated Jun. 30, 2020.
(Continued)

*Primary Examiner* — Hoa C Nguyen
*Assistant Examiner* — John B Freal
(74) *Attorney, Agent, or Firm* — Mattingly & Malur, PC

(57) ABSTRACT

A second main surface of the copper plate is opposite a first main surface of the copper plate, and is bonded to a silicon nitride ceramic substrate by the bonding layer. A first portion and a second portion of an end surface of the copper plate form an angle of 135° to 165° on an outside of the copper plate. An extended plane of the first portion and the second main surface form an angle of 110° to 145° a side where the second portion is located. A distance from the second main surface to an intersection of the first portion and the second portion in a direction of a thickness of the copper plate is 10 to 100 μm. The second main surface extends beyond the extended plane of the first portion by a distance of 10 μm or more.

17 Claims, 15 Drawing Sheets

(51) Int. Cl.
*H01L 23/15* (2006.01)
*H01L 23/373* (2006.01)
*H05K 3/38* (2006.01)

(56) References Cited

U.S. PATENT DOCUMENTS

| 2014/0126155 | A1 | 5/2014 | Imamura et al. |
| 2014/0291699 | A1 | 10/2014 | Yano et al. |
| 2015/0279793 | A1* | 10/2015 | Kuo ................ H01L 23/49816 257/737 |
| 2018/0005918 | A1 | 1/2018 | Naba et al. |
| 2019/0035734 | A1* | 1/2019 | Ho ................... H01L 21/76804 |
| 2019/0371690 | A1* | 12/2019 | Iwasaki ................ H01L 24/83 |

FOREIGN PATENT DOCUMENTS

| JP | 2005-116843 A | 4/2005 |
| JP | 2005-268821 A | 9/2005 |
| JP | 2013-030609 A | 2/2013 |
| JP | 2016-174165 A | 9/2016 |
| JP | 6271629 B2 | 1/2018 |
| WO | 2013/002407 A1 | 1/2013 |

OTHER PUBLICATIONS

International Search Report of OCT/JP2019/015414 dated Jun. 4, 2019.

International Preliminary Report on Patentability received in corresponding International Application No. PCT/JP2019/015414 dated Oct. 21, 2021.

International Preliminary Report on Patentability received in corresponding International Application No. PCT/JP2020/014514 dated Oct. 21, 2021.

Extended European Search Report received in corresponding European Application No. 20787489.2 dated Aug. 21, 2023.

* cited by examiner

F I G. 4
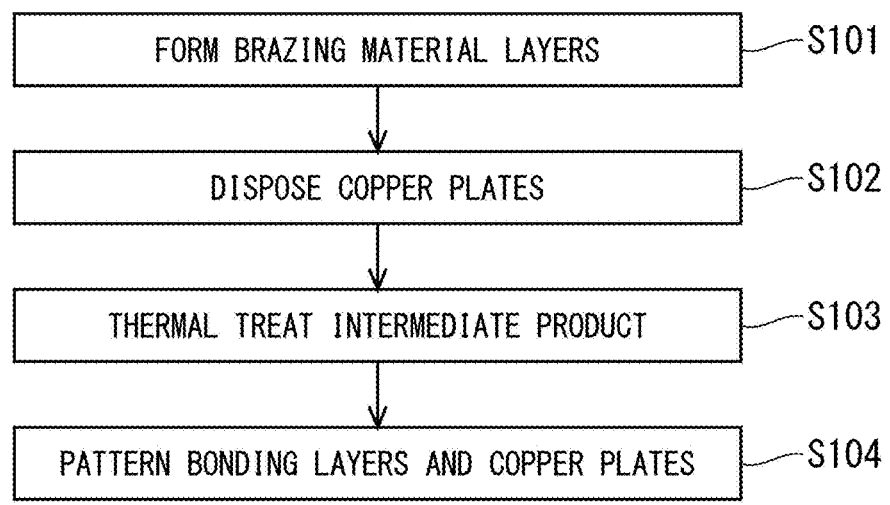

EXAMPLE 16

F I G. 1 5
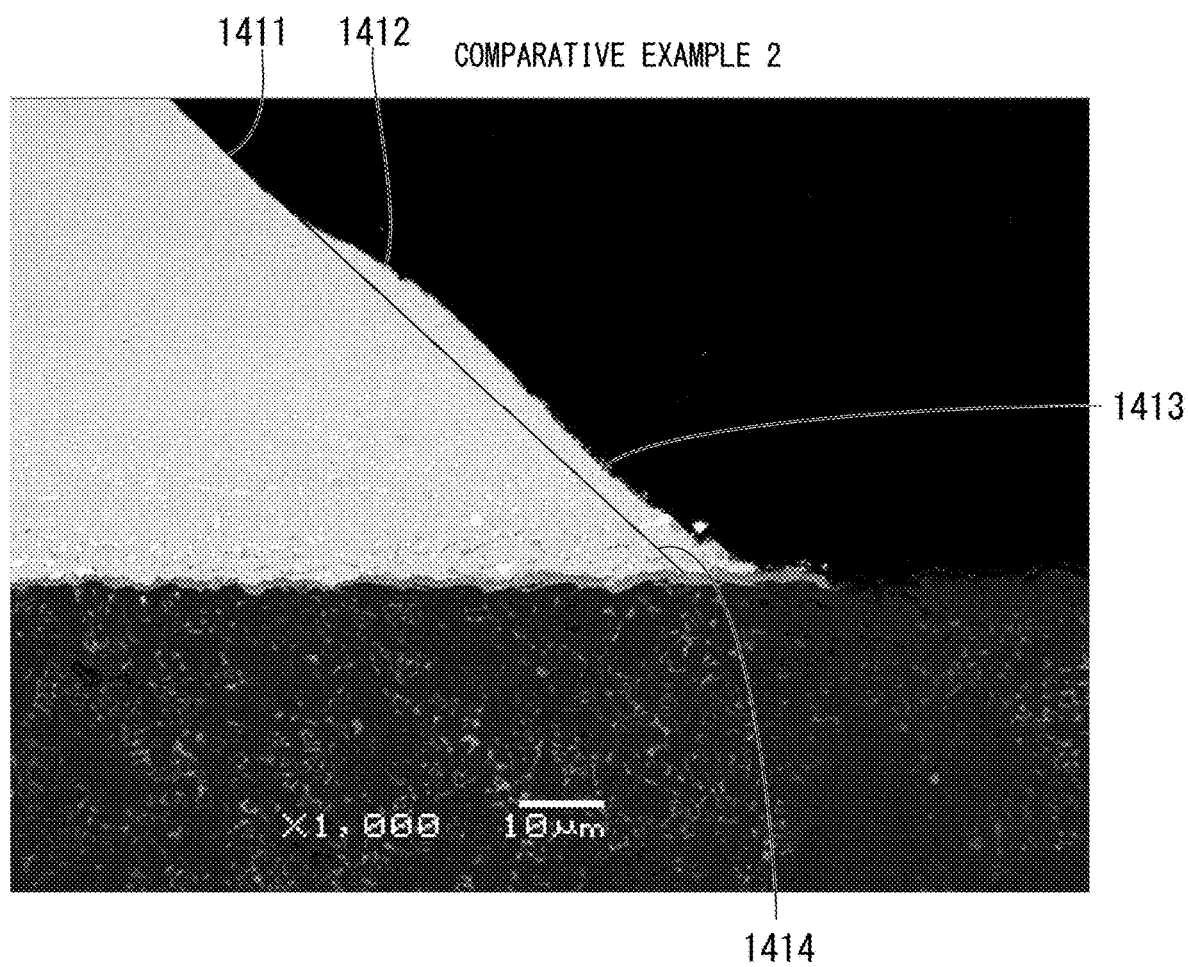

BONDED SUBSTRATE AND MANUFACTURING METHOD OF BONDED SUBSTRATE

CROSS-REFERENCE TO RELATED APPLICATION

This application is a continuation application of PCT/JP2020/014514, filed on Mar. 30, 2020, which claims the benefit of priority of Japanese Patent Application No. PCT/JP2019/015414, filed on Apr. 9, 2019, the entire contents of which are incorporated herein by reference.

BACKGROUND OF THE INVENTION

Field of the Invention

The present invention relates to bonded substrates and manufacturing methods of bonded substrates.

Description of the Background Art

Silicon nitride ceramics are highly heat conductive and highly insulating. A bonded substrate in which a copper plate is bonded to a silicon nitride ceramic substrate through a bonding layer is thus suitable for use as an insulating heat-dissipating substrate on which a power semiconductor device is mounted.

In many cases, the bonded substrate is manufactured by preparing an intermediate product in which a brazing material layer is interposed between the copper plate and the silicon nitride ceramic substrate, changing the brazing material layer into the bonding layer through thermal treating on the prepared intermediate product, and patterning the copper plate and the bonding layer.

Forming, in the bonding layer, a protruding portion protruding from between the silicon nitride ceramic substrate and the copper plate is proposed to suppress a defect of the bonded substrate caused by stress concentration on the end of the copper plate.

In a ceramic circuit board disclosed in Japanese Patent No. 6271629, for example, a copper circuit plate is bonded, through a brazing material layer, to at least one surface of a ceramic substrate formed of silicon nitride. The ceramic circuit board includes a brazing material protruding portion protruding outward from a side surface of the copper circuit plate. This relieves thermal stress, so that a highly reliable ceramic-metal bonded circuit board can be achieved.

In a conventional bonded substrate typified by the ceramic circuit board disclosed in Japanese Patent No. 6271629, a protruding portion protruding from between a silicon nitride ceramic substrate and a copper plate is formed to improve thermal cycling durability of the bonded substrate.

However, improvement in thermal cycling durability of the bonded substrate is expected even when the protruding portion cannot be formed. As for the case that the protruding portion can be formed, further improvement in thermal cycling durability of the bonded substrate is expected.

SUMMARY

The present invention is directed to a bonded substrate.

According to the present invention, the bonded substrate includes a silicon nitride ceramic substrate, a bonding layer, and a copper plate.

The bonding layer and the copper plate are disposed over the silicon nitride ceramic substrate.

A second main surface of the copper plate is opposite a first main surface of the copper plate, and is bonded to the silicon nitride ceramic substrate by the bonding layer. An end surface of the copper plate extends from the first main surface of the copper plate to the second main surface of the copper plate.

The end surface of the copper plate includes a first portion and a second portion. The second portion is closer to the second main surface than the first portion is.

The first portion and the second portion form an angle of 135° or more and 165° or less on an outside of the copper plate. An extended plane of the first portion and the second main surface form an angle of 110° or more and 145° or less on a side where the second portion is located. A distance from the second main surface to an intersection of the first portion and the second portion in a direction of a thickness of the copper plate is 10 µm or more and 100 µm or less. The second main surface extends beyond the extended plane of the first portion by a distance of 10 µm or more.

According to the present invention, the present invention is also directed to a manufacturing method of a bonded substrate.

In the manufacturing method of the bonded substrate, a brazing material layer is formed on a silicon nitride ceramic substrate. The brazing material layer contains an active metal brazing material. The active metal brazing material includes metal powder containing silver and at least one metal hydride powder selected from the group consisting of titanium hydride powder and zirconium hydride powder. The brazing material layer has a thickness of 0.1 µm or more and 10 µm or less.

A copper plate is disposed on the brazing material layer. An intermediate product including the silicon nitride ceramic substrate, the brazing material layer, and the copper plate is thereby obtained.

The intermediate product is thermally treated. The brazing material layer is thereby changed into a bonding layer to bond the copper plate to the silicon nitride ceramic substrate. Silver contained in the brazing material layer is diffused into the copper plate. A first thickness-direction region containing silver and having a first silver concentration and a second thickness-direction region having a second silver concentration lower than the first silver concentration are formed in the copper plate.

The first thickness-direction region is etched at a first etching rate, and the second thickness-direction region is etched at a second etching rate faster than the first etching rate.

According to the present invention, when the bonded substrate is exposed to thermal cycling, stress is caused to be distributed to the vicinity of a corner between the first portion and the second portion and the vicinity of a corner between the second main surface and the end surface. Stress caused in the vicinity of each of the corners is thus reduced. Thermal cycling durability of the bonded substrate is thereby improved.

It is therefore an object of the invention to improve thermal cycling durability of a bonded substrate in which a copper plate is bonded to a silicon nitride ceramic substrate through a bonding layer.

The objects, features, aspects, and advantages of the present invention will become more apparent from the following detailed description and the accompanying drawings.

BRIEF DESCRIPTION OF THE DRAWINGS

FIG. 4 is a flowchart showing a sequence in manufacturing the bonded substrate.

FIG. 15 shows an SEM image of a cross section of a bonded substrate manufactured in Comparative Example 2.

DESCRIPTION OF THE PREFERRED EMBODIMENTS

1 Bonded Substrate

Figure 1:
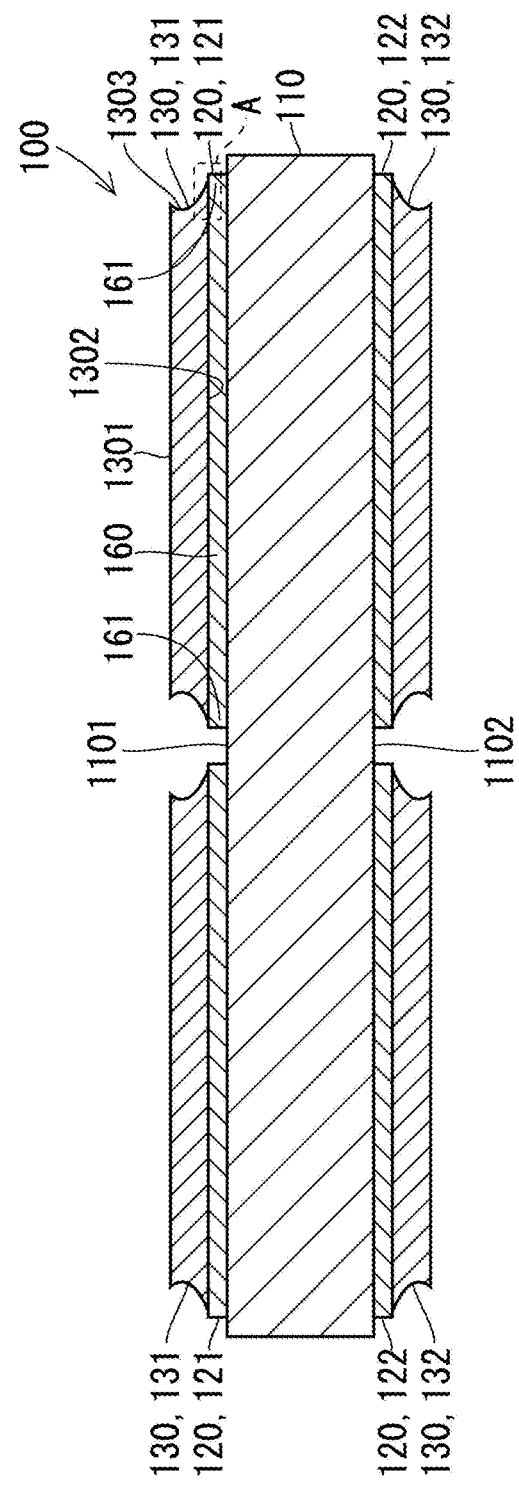
FIG. 1 is a cross-sectional view schematically showing a bonded substrate.
Figure 2:
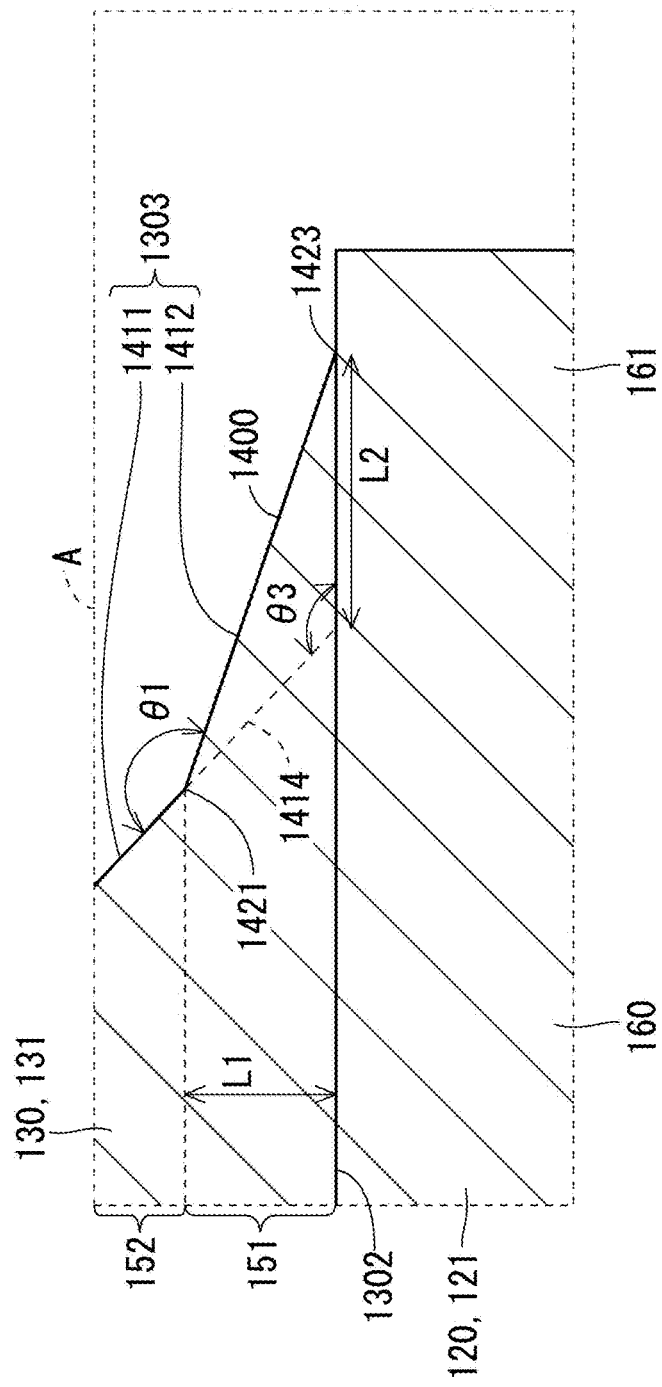
FIG. 2 is an enlarged cross-sectional view schematically showing a portion of the bonded substrate.
Figure 3:
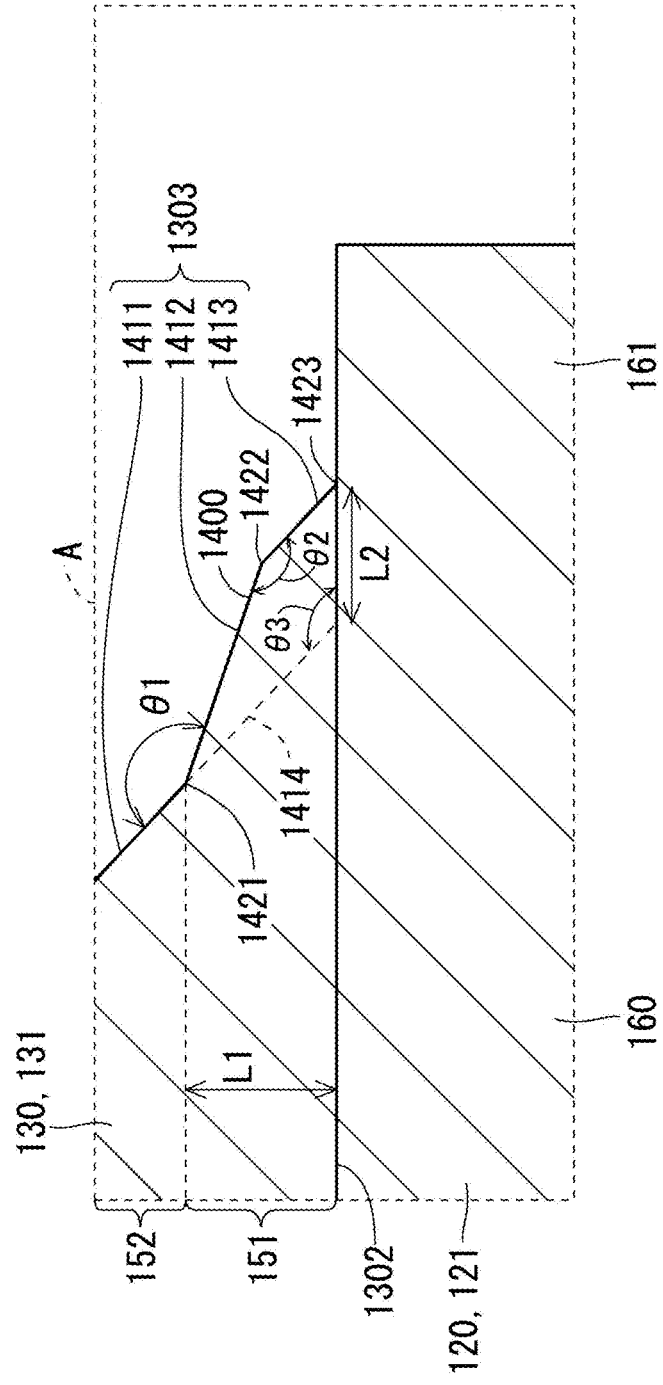
FIG. 3 is an enlarged cross-sectional view schematically showing a portion of the bonded substrate.

FIG. 1 is a cross-sectional view schematically showing a bonded substrate 100 according to this embodiment. FIGS. 2 and 3 are enlarged cross-sectional views each schematically showing a portion of the bonded substrate 100. FIGS. 2 and 3 are each an enlarged view of a portion A of FIG. 1.

As illustrated in FIG. 1, a bonded substrate 100 includes a silicon nitride ceramic substrate 110, a bonding layer 121, a copper plate 131, a bonding layer 122, and a copper plate 132. The bonded substrate 100 may include components other than these components. One of a pair of the bonding layer 121 and the copper plate 131 and a pair of the bonding layer 122 and the copper plate 132 may be omitted.

The bonding layer 121 and the copper plate 131 are disposed over a main surface 1101 of the silicon nitride ceramic substrate 110. The bonding layer 122 and the copper plate 132 are disposed over a main surface 1102 of the silicon nitride ceramic substrate 110.

The copper plates 131 and 132 are bonded to the silicon nitride ceramic substrate 110 respectively by the bonding layers 121 and 122. The copper plates 131 and 132 and the main surfaces 1101 and 1102 of the silicon nitride ceramic substrate 110 are brazed respectively by the bonding layers 121 and 122 by active metal brazing.

The bonded substrate 100 may be intended for any applications, and is used, for example, as an insulating heat-dissipating substrate on which a power semiconductor device is mounted.

Hereinafter, each of the copper plates 131 and 132 is referred to as a copper plate 130, and each of the bonding layers 121 and 122 to bond the copper plate 130 to the silicon nitride ceramic substrate 110 is referred to as a bonding layer 120.

2 Relief of Stress Concentration on End of Copper Plate by Flared Portion of End Surface of Copper Plate As illustrated in FIG. 1, the copper plate 130 has a first main surface 1301, a second main surface 1302, and an end surface 1303. The second main surface 1302 is opposite the first main surface 1301, and is bonded to the silicon nitride ceramic substrate 110 by the bonding layer 120. The end surface 1303 extends from the first main surface 1301 to the second main surface 1302.

The end surface 1303 has a flared portion 1400 illustrated in FIG. 2 or 3.

When the end surface 1303 has the flared portion 1400 illustrated in FIG. 2, the end surface 1303 includes a first portion 1411 and a second portion 1412. The second portion 1412 is closer to the second main surface 1302 than the first portion 1411 is. The first portion 1411 and the second portion 1412 are each substantially flat.

The first portion 1411 and the second portion 1412 form an angle θ1 of 135° or more and 165° or less on the outside of the copper plate 130. An extended plane 1414 of the first portion 1411 and the second main surface 1302 form an angle θ3 of 110° or more and 145° or less on a side where the second portion 1412 is located. An intersection 1421 of the first portion 1411 and the second portion 1412 is preferably separated from the second main surface 1302 by a distance L1 of 10 μm or more and 100 μm or less in a direction of the thickness of the copper plate 130, and is more preferably separated from the second main surface 1302 by a distance L1 of 10 μm or more and 60 μm or less in the direction of the thickness of the copper plate 130. The second main surface 1302 extends beyond the extended plane 1414 of the first portion 1411 by a distance L2 of 10 μm or more. A direction of a normal to the extended plane 1414 is the same as a direction of a normal to the first portion 1411 at a location closest to the second main surface 1302.

The copper plate 130 has a corner 1421 between the first portion 1411 and the second portion 1412 and a corner 1423 between the second main surface 1302 and the second portion 1412. Thus, stress is caused to be distributed to the vicinity of the corner 1421 and the vicinity of the corner 1423 when the bonded substrate 100 is exposed to thermal cycling. In this case, stress caused in the vicinity of each of the corners 1421 and 1423 is small, so that thermal cycling durability of the bonded substrate 100 is improved.

When the angle θ1 is less than 135°, stress is excessively concentrated on the vicinity of the corner 1421, and obtaining an effect of improving thermal cycling durability of the bonded substrate 100 tends to be difficult. When the angle θ1 is more than 165°, stress is not distributed to the vicinity of the corner 1421, and obtaining the effect of improving thermal cycling durability of the bonded substrate 100 tends to be difficult. When the angle θ3 is less than 110°, stress is concentrated on the flared portion 1400, and obtaining the effect of improving thermal cycling durability of the bonded substrate 100 tends to be difficult. When the angle θ3 is more than 145°, stress is not distributed to the flared portion 1400, and obtaining the effect of improving thermal cycling durability of the bonded substrate 100 tends to be difficult.

Thermal cycling durability of the bonded substrate 100 can further be improved when the distance L1 is 10 μm or more and 100 μm or less, and thermal cycling durability of the bonded substrate 100 can particularly be improved when the distance L1 is 10 μm or more and 60 μm or less. When the distance L1 is less than these ranges, the corners 1421 and 1423 are brought closer to each other, stress is not distributed, and obtaining the effect of improving thermal cycling durability of the bonded substrate 100 tends to be difficult. When the distance L1 is more than these ranges, stress is not caused in the vicinity of the corner 1421, and obtaining the effect of improving thermal cycling durability of the bonded substrate 100 tends to be difficult. When the distance L2 is less than 10 μm, stress is not distributed, and obtaining the effect of improving thermal cycling durability of the bonded substrate 100 tends to be difficult.

When the end surface 1303 has the flared portion 1400 illustrated in FIG. 3, the end surface 1303 includes the first portion 1411, the second portion 1412, and a third portion 1413. The second portion 1412 is closer to the second main surface 1302 than the first portion 1411 is. The third portion 1413 is closer to the second main surface 1302 than the second portion 1412 is. The first portion 1411, the second portion 1412, and the third portion 1413 are each substantially flat.

The first portion 1411 and the second portion 1412 form the angle θ1 of 135° or more and 165° or less on the outside of the copper plate 130. The second portion 1412 and the third portion 1413 form an angle θ2 of 135° or more and 165° or less on the inside of the copper plate 130. The extended plane 1414 of the first portion 1411 and the second main surface 1302 form the angle θ3 of 110° or more and 145° or less on the side where the second portion 1412 is located. The intersection 1421 of the first portion 1411 and the second portion 1412 is preferably separated from the second main surface 1302 by the distance L1 of 10 μm or more and 100 μm or less in the direction of the thickness of the copper plate 130, and is more preferably separated from the second main surface 1302 by the distance L1 of 10 μm or more and 60 μm or less in the direction of the thickness of the copper plate 130. The second main surface 1302 extends beyond the extended plane 1414 of the first portion 1411 by the distance L2 of 10 μm or more. The direction of the normal to the extended plane 1414 is the same as the direction of the normal to the first portion 1411 at the location closest to the second main surface 1302.

The copper plate 130 has the corner 1421 between the first portion 1411 and the second portion 1412, a corner 1422 between the second portion 1412 and the third portion 1413, and the corner 1423 between the second main surface 1302 and the third portion 1413. When the bonded substrate 100 is exposed to thermal cycling, stress is caused to be distributed to the vicinity of the corner 1421, the vicinity of the corner 1422, and the vicinity of the corner 1423. Stress caused in the vicinity of each of the corners 1421, 1422, and 1423 is thus reduced. Thermal cycling durability of the bonded substrate 100 is thereby improved. Stress is distributed not only to the vicinity of the corner 1421 and the vicinity of the corner 1423 but also to the vicinity of the corner 1422, so that thermal cycling durability of the bonded substrate 100 is further improved compared with a case where stress is distributed only to the vicinity of the corner 1421 and the vicinity of the corner 1423.

When the angle θ1 is less than 135°, stress is excessively concentrated on the vicinity of the corner 1421, and obtaining the effect of improving thermal cycling durability of the bonded substrate 100 tends to be difficult. When the angle θ1 is more than 165°, stress is not distributed to the vicinity of the corner 1421, and obtaining the effect of improving thermal cycling durability of the bonded substrate 100 tends to be difficult. The same applies to the angle θ2. When the angle θ3 is less than 110°, stress is concentrated on the flared portion 1400, and obtaining the effect of improving thermal cycling durability of the bonded substrate 100 tends to be difficult. When the angle θ3 is more than 145°, stress is not distributed to the flared portion 1400, and obtaining the effect of improving thermal cycling durability of the bonded substrate 100 tends to be difficult. Thermal cycling durability of the bonded substrate 100 can further be improved when the distance L1 is 10 μm or more and 100 μm or less, and thermal cycling durability of the bonded substrate 100 can particularly be improved when the distance L1 is 10 μm or more and 60 μm or less. When the distance L1 is less than these ranges, the corners 1421, 1422, and 1423 are brought closer to one another, stress is not distributed to a wide range, and obtaining the effect of improving thermal cycling durability of the bonded substrate 100 tends to be difficult. When the distance L1 is more than these ranges, stress is not distributed to the vicinity of the corner 1421 and the vicinity of the corner 1422, and obtaining the effect of improving thermal cycling durability of the bonded substrate 100 tends to be difficult. When the distance L2 is less than 10 μm, stress is not distributed, and obtaining the effect of improving thermal cycling durability of the bonded substrate 100 tends to be difficult.

3 Distribution of Silver Concentration

The copper plate 130 has silver concentration distribution in which a silver concentration decreases with increasing distance from the second main surface 1302. The silver concentration decreases with increasing distance from the second main surface 1302 because silver is diffused from a brazing material layer as a precursor of the bonding layer 120 into the copper plate 130 in the process of manufacturing the bonded substrate 100.

The copper plate 130 thus includes a first thickness-direction region 151 containing silver and having a first silver concentration and a second thickness-direction region 152 having a second silver concentration lower than the first silver concentration as illustrated in FIGS. 2 and 3. A state of the second thickness-direction region 152 having the second silver concentration lower than the first silver concentration includes both of a state of the second thickness-direction region 152 not containing silver and a state of the second thickness-direction region 152 containing silver with the lower concentration than the first silver concentration, and the former is preferable.

When the end surface 1303 has the flared portion 1400 illustrated in FIG. 2, the first thickness-direction region 151 has the second portion 1412. When the end surface 1303 has the flared portion 1400 illustrated in FIG. 3, the first thickness-direction region 151 has the second portion 1412 and the third portion 1413. The second thickness-direction region 152 has the first portion 1411.

Supposing that the first thickness-direction region 151 is etched in a first etching rate by an etchant for the copper plate 130 and the second thickness-direction region 152 is etched in a second etching rate by the etchant, the second etching rate is faster than the first etching rate. This is because the second silver concentration is lower than the first silver concentration.

The flared portion 1400 of the end surface 1303 is formed by etching utilizing the relationship that the second etching rate is faster than the first etching rate. The flared portion 1400 of the end surface 1303 may be formed by a method other than etching. For example, the flared portion 1400 of the end surface 1303 may be formed by machining.

4 Relief of Stress Concentration on End of Copper Plate by Protruding Portion of Bonding Layer The bonding layer 120 includes an interplate portion 160 and a protruding portion 161 as illustrated in FIGS. 1, 2, and 3. The interplate portion 160 is interposed between the silicon nitride ceramic substrate 110 and the copper plate 130. The protruding portion 161 protrudes from between the silicon nitride ceramic substrate 110 and the copper plate 130. In the bonded substrate 100, stress concentration on the end of the copper plate 130 is relieved by the protruding portion 161. A defect of the bonded substrate 100 caused by stress concentration on the end of the copper plate 130 can thereby be suppressed.

The bonding layer 120 preferably has a thickness of 0.1 μm or more and 5 μm or less, and more preferably has a thickness of 0.1 μm or more and 3 μm or less. The bonding layer 120 has such a small thickness, so that stress concentration on the end of the copper plate 130 is effectively relieved by the protruding portion 161.

5 Thickness of Copper Plate

The copper plate 130 preferably has a thickness of 0.5 mm or more. When the copper plate 130 has a thickness of 0.5 mm or more, the bonded substrate 100 being highly heat dissipating can be obtained. On the other hand, when the copper plate 130 has a thickness of 0.5 mm or more, large stress is caused in the copper plate 130, and thermal cycling durability of the bonded substrate 100 tends to be reduced. In the bonded substrate 100, however, the above-mentioned effect of improving thermal cycling durability can compensate for reduction in thermal cycling durability when the copper plate 130 has a thickness of 0.5 mm or more.

6 Distance L2

The distance L2 is preferably 100 μm or less, more preferably 60 μm or less, even more preferably 40 μm, and most preferably 30 μm or less. When the distance L2 is more than these upper limits, adjacent two copper plates 130 are brought closer to each other, and insulation between the adjacent two copper plates 130 tends to be reduced.

7 Manufacturing Method of Bonded Substrate

Figure 5:
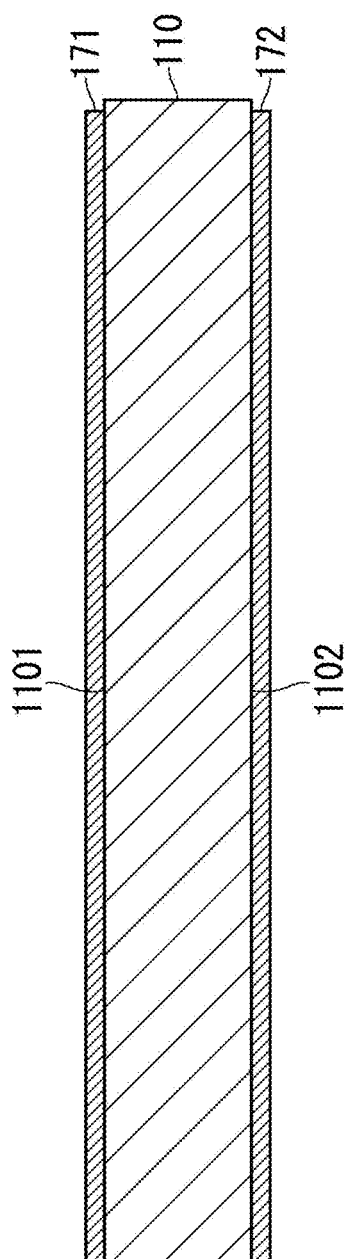
FIG. 5 is a cross-sectional view schematically showing an intermediate product obtained in the process of manufacturing the bonded substrate.
Figure 6:
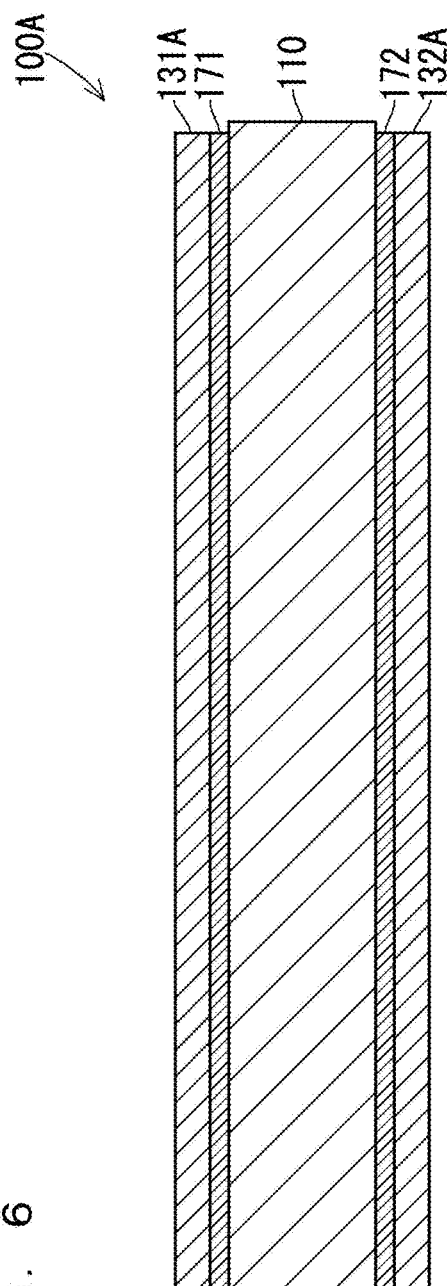
FIG. 6 is a cross-sectional view schematically showing an intermediate product obtained in the process of manufacturing the bonded substrate.
Figure 7:
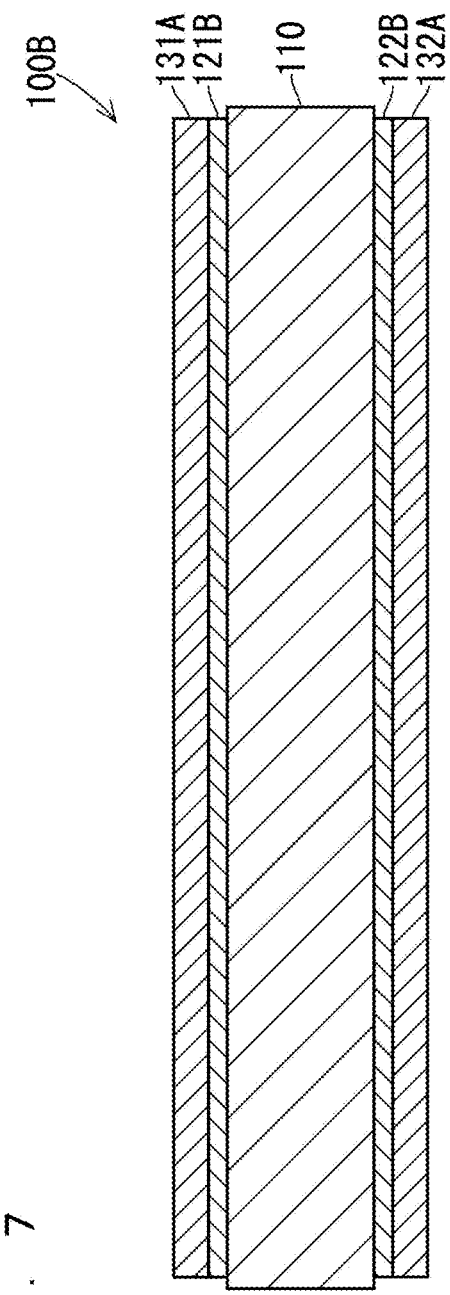
FIG. 7 is a cross-sectional view schematically showing an intermediate product obtained in the process of manufacturing the bonded substrate.

FIG. 4 is a flowchart showing a sequence in manufacturing the bonded substrate 100. FIGS. 5, 6, and 7 are cross-sectional views schematically showing intermediate products obtained in the process of manufacturing the bonded substrate 100.

In the manufacture of the bonded substrate 100 in the first embodiment, steps S101 to S104 shown in FIG. 4 are sequentially performed.

In step S101, brazing material layers 171 and 172 are formed respectively on the main surfaces 1101 and 1102 of the silicon nitride ceramic substrate 110 as illustrated in FIG. 5. When the bonding layer 121 and the copper plate 131 are omitted from the bonded substrate 100, formation of the brazing material layer 171 is omitted. When the bonding layer 122 and the copper plate 132 are omitted from the bonded substrate 100, formation of the brazing material layer 172 is omitted.

When the brazing material layers 171 and 172 are formed, a paste containing an active metal brazing material and a solvent is prepared. The paste may further contain a binder, a dispersant, an antifoaming agent, and the like. The prepared paste is then screen printed on the main surfaces 1101 and 1102 of the silicon nitride ceramic substrate 110 to form first and second screen printed films respectively on the main surfaces 1101 and 1102 of the silicon nitride ceramic substrate 110. The solvent contained in the formed first and second screen printed films is then volatilized. The first and second screen printed films are thereby respectively changed into the brazing material layers 171 and 172. The brazing material layers 171 and 172 each contain the active metal brazing material. The brazing material layers 171 and 172 may be formed by a method different from this method.

The active metal brazing material includes metal powder containing silver (Ag), copper (Cu), and indium (In), and at least one metal hydride powder selected from the group consisting of titanium hydride powder and zirconium hydride powder. The composition of the active metal brazing material may be changed. For example, one or both of copper and indium may not be contained in the metal powder, and a metallic element other than copper and indium, such as tin (Sn), may be contained in the metal powder.

The active metal brazing material preferably contains silver of 40 wt % or more and 80 wt % or less. In this case, it is facilitated to diffuse silver into copper plates 131A and 132A to cause silver not to be contained in bonding layers 121B and 122B in step S103, which will be described below.

The active metal brazing material is preferably formed of powder having an average particle diameter of 0.1 μm or more and 10 μm or less. The average particle diameter can be obtained by measuring particle size distribution using a commercially available laser diffraction particle size distribution analyzer, and calculating D50 (a median diameter) from the measured particle size distribution. The active metal brazing material is formed of powder having such a small average particle diameter, so that the brazing material layers 171 and 172 can each have a small thickness.

The brazing material layers 171 and 172 each preferably have a thickness of 0.1 μm or more and 10 μm or less, and more preferably have a thickness of 0.1 μm or more and 5 μm or less. The brazing material layers 171 and 172 each have such a small thickness, so that the brazing material layers 171 and 172 each contain a small amount of silver, and it is facilitated to diffuse silver into the copper plates 131A and 132A to cause silver not to be contained in the bonding layers 121B and 122B in step S103, which will be described below.

In step S102, the copper plates 131A and 132A are disposed respectively on the formed brazing material layers 171 and 172 as illustrated in FIG. 6. An intermediate product 100A including the silicon nitride ceramic substrate 110, the brazing material layer 171, the copper plate 131A, the brazing material layer 172, and the copper plate 132A is thereby obtained. When the bonding layer 121 and the copper plate 131 are omitted from the bonded substrate 100, disposition of the copper plate 131A is omitted. When the bonding layer 122 and the copper plate 132 are omitted from the bonded substrate 100, disposition of the copper plate 132A is omitted.

In step S103, the obtained intermediate product 100A is thermally treated. The brazing material layers 171 and 172 are thereby respectively changed into the bonding layers 121B and 122B as illustrated in FIG. 7, and an intermediate product 100B including the silicon nitride ceramic substrate 110, the bonding layer 121B, the copper plate 131A, the bonding layer 122B, and the copper plate 132A is obtained. The bonding layers 121B and 122B respectively bond the copper plates 131A and 132A to the silicon nitride ceramic substrate 110. While the brazing material layers 171 and 172 are respectively changed into the bonding layers 121B and 122B, silver and indium contained in the brazing material layers 171 and 172 are respectively diffused into the copper plates 131A and 132A. Bonding layers 121B and 122B thus obtained do not contain silver and indium. Accordingly, the bonding layers 121B and 122B of the intermediate product 100B obtained through the thermal treatment each contain a compound of at least one element selected from the group (first group) consisting of titanium and zirconium and at least one element selected from the group (second group) consisting of nitrogen and silicon, but do not contain silver and indium. The at least one element selected from the second group is supplied from the silicon nitride ceramic substrate 110. In each of the copper plates 131A and 132A, the first thickness-direction region 151 containing silver and having the first silver concentration and the second thickness-direction region 152 having the second silver concentration lower than the first silver concentration are formed.

When the intermediate product 100A is thermally treated, the intermediate product 100A is preferably hot pressed. When the intermediate product 100A is hot pressed, the intermediate product 100A is preferably pressurized in a direction of the thickness of the silicon nitride ceramic substrate 110 in accordance with a contact pressure profile having a maximum contact pressure of 5 MPa or more and 25 MPa or less, and is heated in accordance with a temperature profile having a maximum temperature of 800° C. or more and 900° C. or less in a vacuum or an inert gas. With this condition, even in the case where the brazing material layers 171 and 172 each have a thin thickness of 0.1 µm or more and 10 µm or less, for example, the copper plates 131A and 132A can be bonded to the silicon nitride ceramic substrate 110 without forming any void. Furthermore, an amount of silver is lowered by thinning the brazing material layers 171 and 172 to the extent that voids are not formed therein as above, it is facilitated to diffuse silver into the copper plates 131A and 132A through the thermal treatment to cause silver not to be contained in the bonding layers 121B and 122B. The shape of particles constituting the active metal brazing material is changed into a layered shape, and silver and the like are diffused into the copper plates 131A and 132A, so that the bonding layers 121B and 122B each substantially have a thickness of 0.1 µm or more and 5 µm or less.

In step S104, the bonding layer 121B, the copper plate 131A, the bonding layer 122B, and the copper plate 132A are patterned. The bonding layers 121B and 122B are thereby respectively changed into the patterned bonding layers 121 and 122 illustrated in FIG. 1. The copper plates 131A and 132A are respectively changed into the patterned copper plates 131 and 132 illustrated in FIG. 1.

8 Patterning of Bonding Layers and Copper Plates

Figure 8:
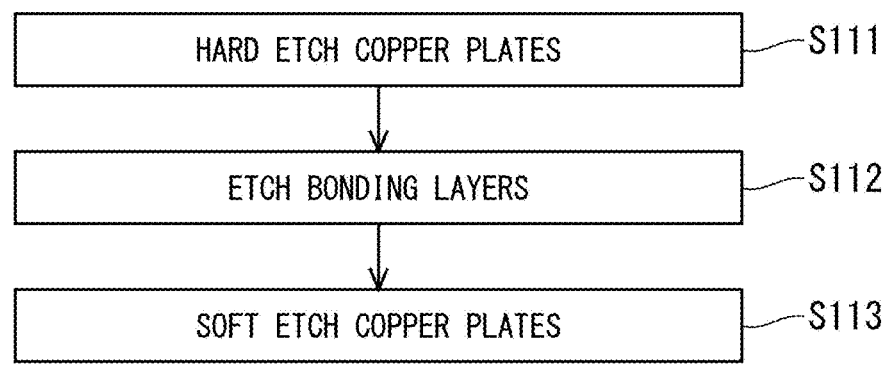
FIG. 8 is a flowchart showing a sequence in patterning bonding layers and copper plates in the manufacture of the bonded substrate.
Figure 9:
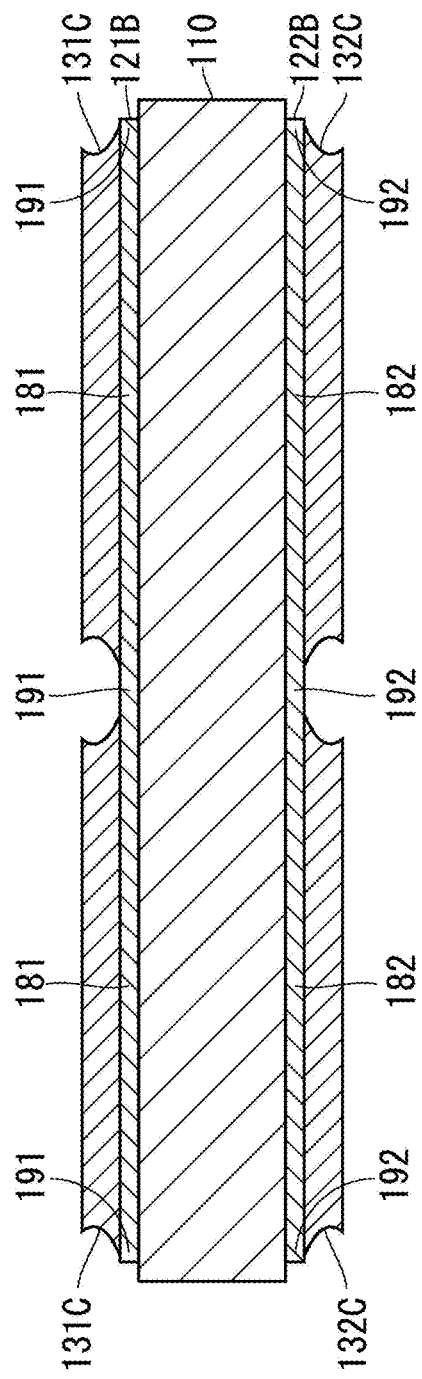
FIG. 9 is a cross-sectional view schematically showing an intermediate product obtained in the process of patterning the bonding layers and the copper plates in the manufacture of the bonded substrate.
Figure 10:
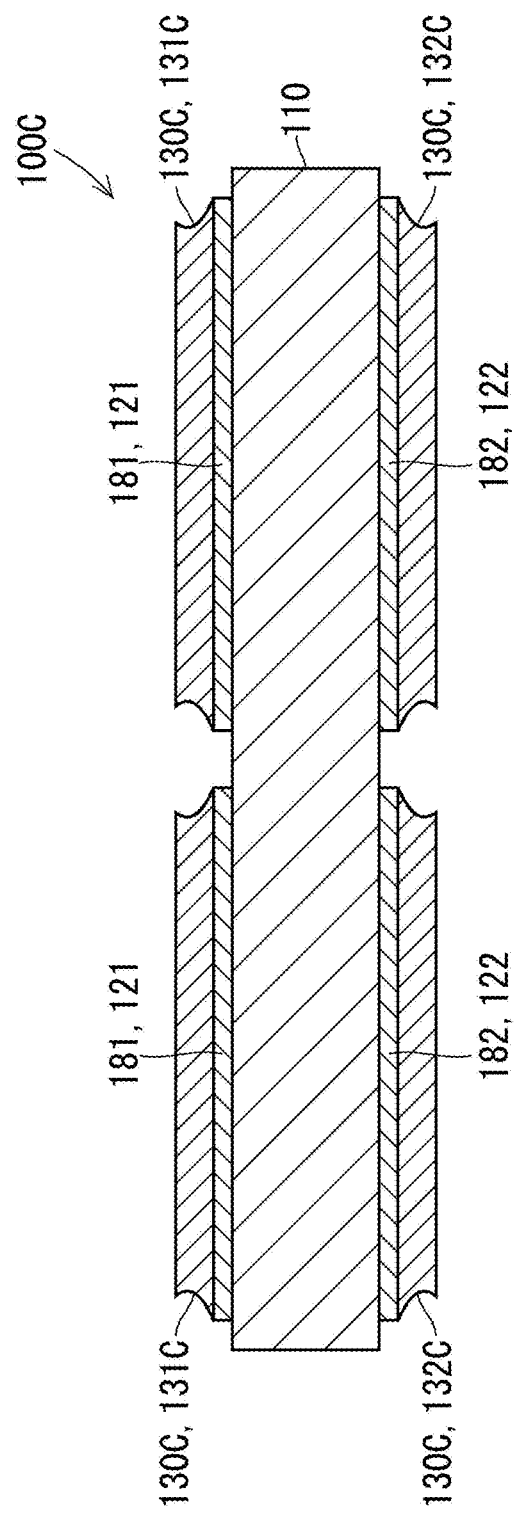
FIG. 10 is a cross-sectional view schematically showing an intermediate product obtained in the process of patterning the bonding layers and the copper plates in the manufacture of the bonded substrate.
Figure 11:
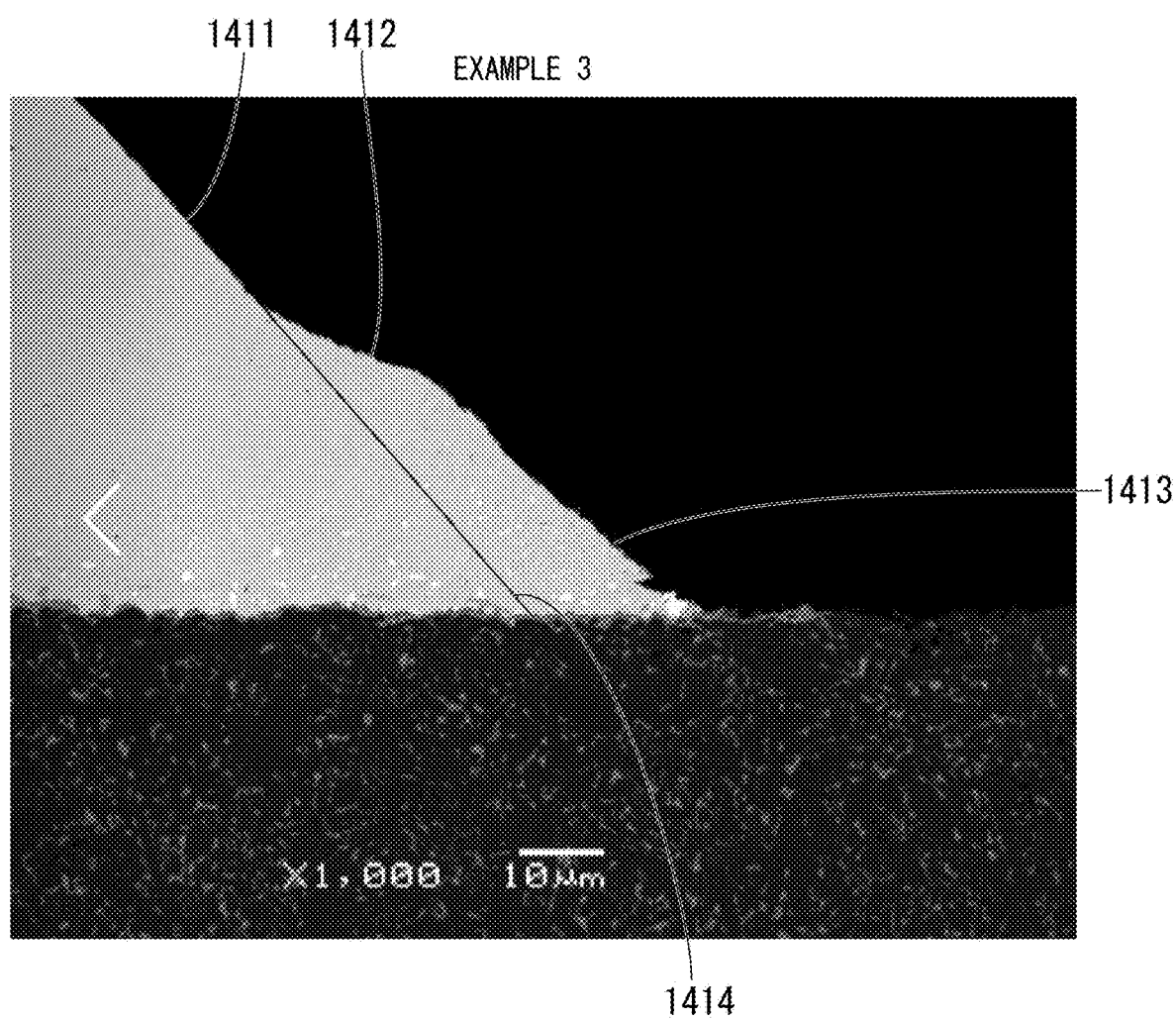
FIG. 11 shows a scanning electron microscope (an SEM) image of a cross section of a bonded substrate manufactured in Example 3.
Figure 12:
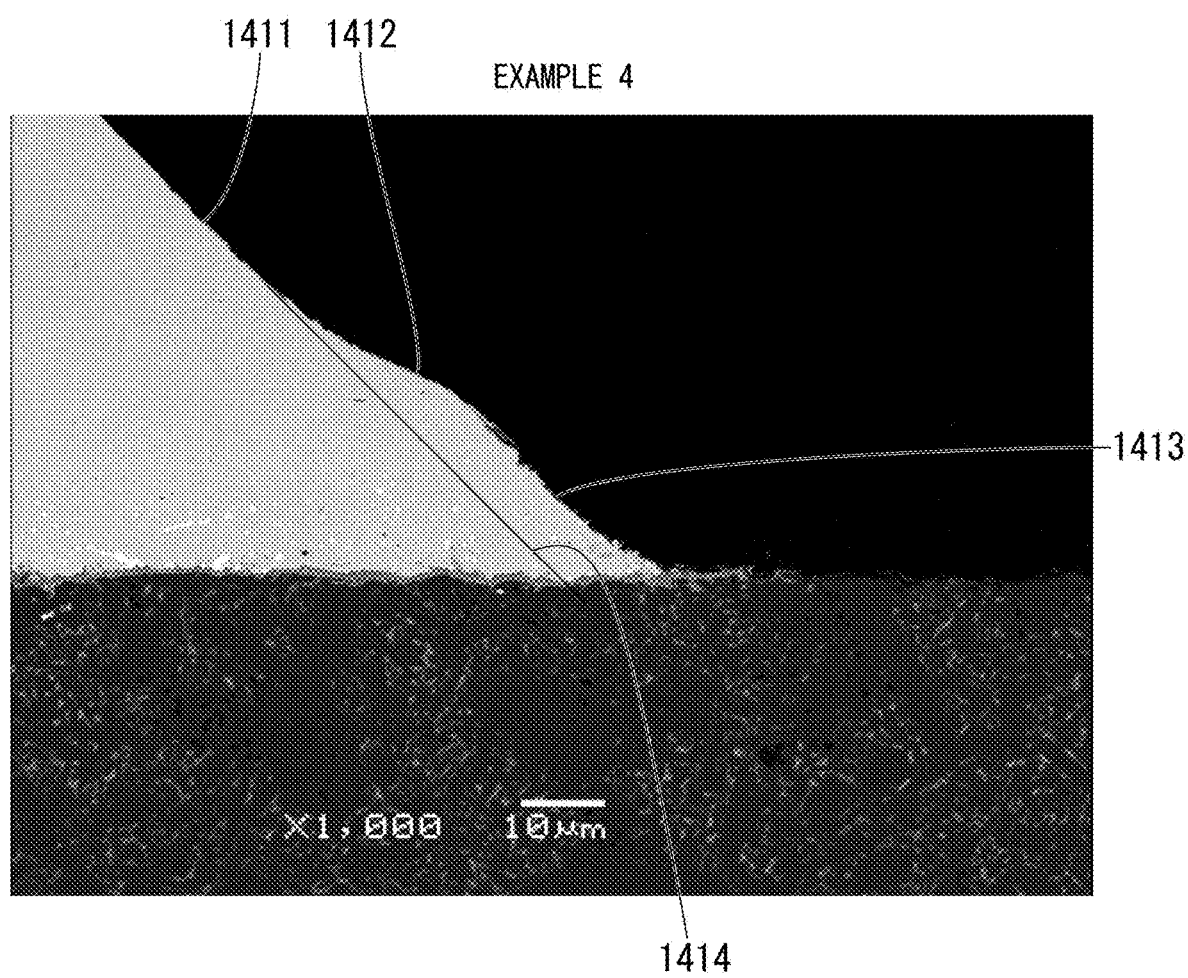
FIG. 12 shows an SEM image of a cross section of a bonded substrate manufactured in Example 4.
Figure 13:
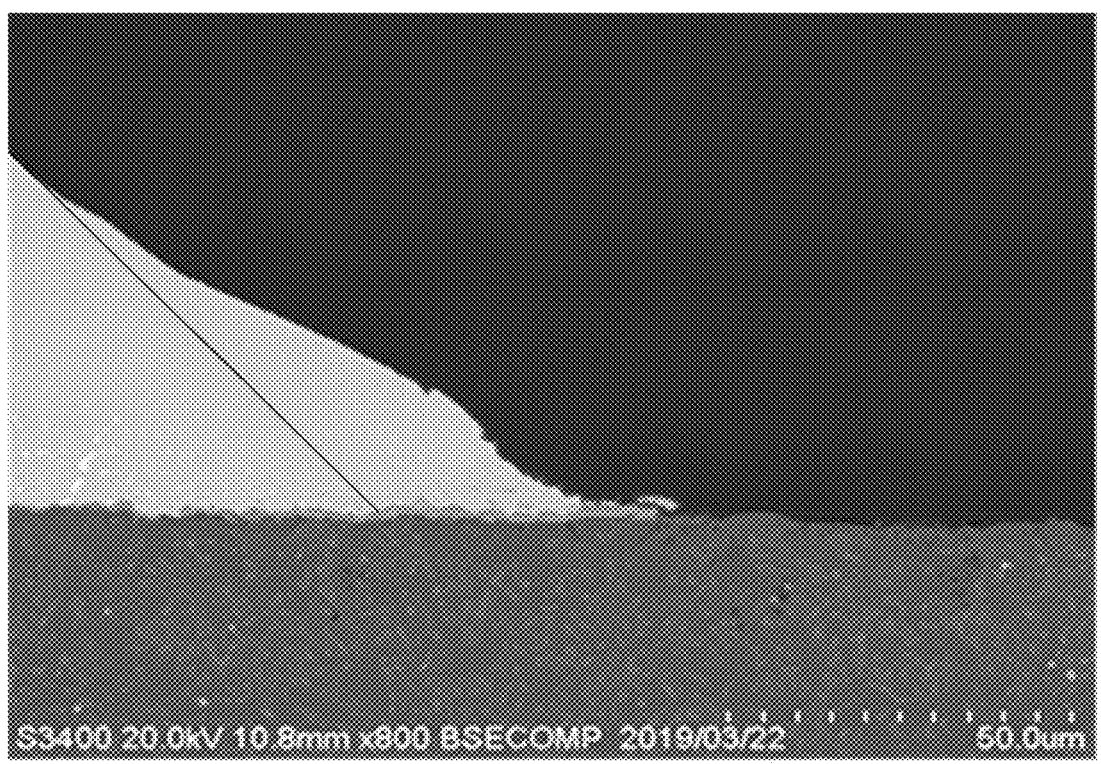
FIG. 13 shows an SEM image of a cross section of a bonded substrate manufactured in Example 15.
Figure 14:
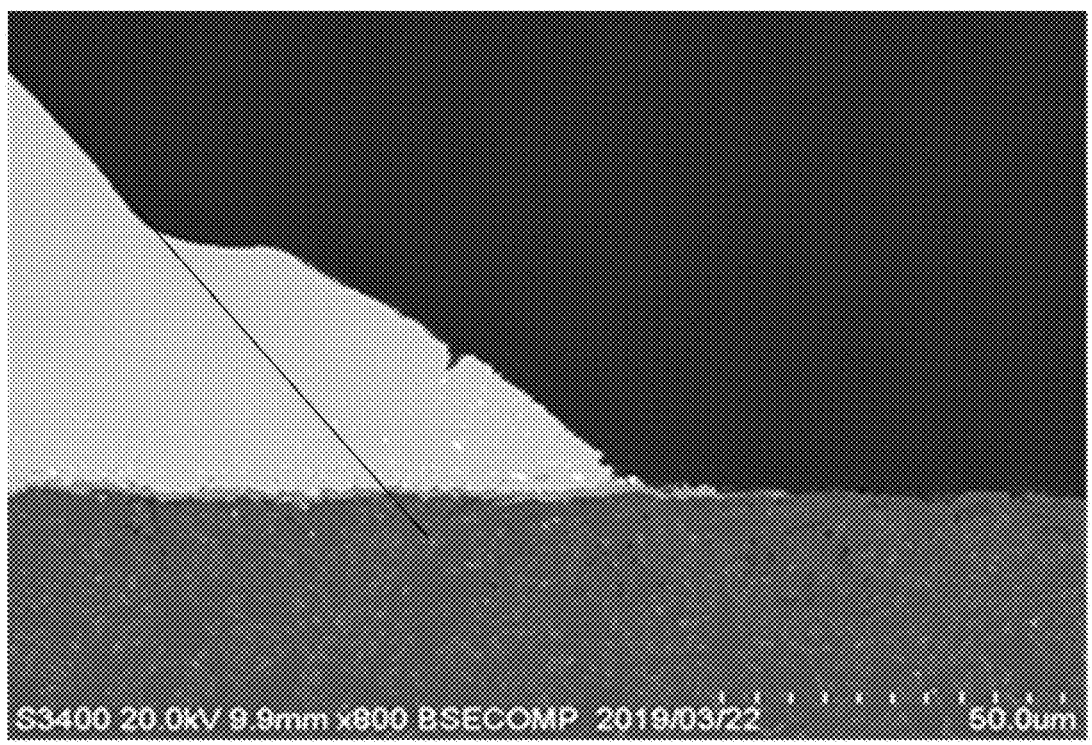
FIG. 14 shows an SEM image of a cross section of a bonded substrate manufactured in Example 16.

FIG. 8 is a flowchart showing a sequence in patterning the bonding layers and the copper plates in the manufacture of the bonded substrate 100. FIGS. 9 and 10 are cross-sectional views schematically showing intermediate products obtained in the process of patterning the bonding layers and the copper plates in the manufacture of the bonded substrate 100.

In patterning the bonding layer 121B, the copper plate 131A, the bonding layer 122B, and the copper plate 132A in the manufacture of the bonded substrate 100, steps S111 to S113 shown in FIG. 8 are sequentially performed.

In step S111, the copper plates 131A and 132A are hard etched. Portions of the copper plates 131A and 132A are thereby removed, so that the copper plates 131A and 132A are respectively changed into etched copper plates 131C and 132C as illustrated in FIG. 9. Concurrently, in the bonding layer 121B, a first portion 181 positioning between the silicon nitride ceramic substrate 110 and the etched copper plate 131C and a second portion 191 positioning except between the silicon nitride ceramic substrate 110 and the etched copper plate 131C are formed. In the bonding layer 122B, a first portion 182 positioning between the silicon nitride ceramic substrate 110 and the etched copper plate 132C and a second portion 192 positioning except between the silicon nitride ceramic substrate 110 and the etched copper plate 132C are formed. An etchant such as an iron chloride aqueous solution and a copper chloride aqueous solution can be used for hard etching of the copper plates 131A and 132A.

In step S112, the second portions 191 and 192 of the bonding layers 121B and 122B are etched. The second portions 191 and 192 are thus removed, and the first portions 181 and 182 remain as illustrated in FIG. 10. The remaining first portions 181 and 182 respectively serve as the bonding layers 121 and 122 of the bonded substrate 100 as illustrated in FIG. 1. An intermediate product 100C including the silicon nitride ceramic substrate 110, the bonding layer 121, the copper plate 131C, the bonding layer 122, and the copper plate 132C is thereby obtained. An etchant such as an ammonium fluoride aqueous solution can be used for etching of the second portions 191 and 192. In step S112, opposite ends of each of the first portions 181 and 182 are sometimes etched.

In step S113, the etched copper plates 131C and 132C are further soft etched. The the ends of the etched copper plates 131C and 132C are thereby removed. With this, the etched copper plates 131C and 132C are respectively changed into the patterned copper plates 131 and 132 illustrated in FIG. 1. Accordingly, the interplate portion 160 and the protruding portion 161 illustrated in FIG. 1 are formed in each of the bonding layers 121 and 122. The etchant such as the iron chloride aqueous solution and the copper chloride aqueous solution can be used for soft etching of the etched copper plates 131C and 132C. In step S113, the protruding portion 161 can surely be formed, even when the opposite ends of each of the first portions 181 and 182 are removed by etching in step S112.

When each copper plate 130C included in the copper plates 131C and 132C is soft etched, the first thickness-direction region 151 having the first silver concentration is etched at the first etching rate. The second thickness-direction region 152 having the second silver concentration lower than the first silver concentration is etched at the second etching rate faster than the first etching rate. The flared portion 1400 of the end surface 1303 is thereby formed.

9 Influence of Manufacturing Conditions on Flared Portion

Whether the flared portion 1400 is formed and the shape of the formed flared portion 1400 are dependent mainly on the amount of silver diffused into the copper plates 131A and 132A and severity of soft etching. Manufacturing conditions are thus determined so that the flared portion 1400 having an appropriate shape is formed when the bonded substrate 100 is manufactured, considering the influence on the amount of silver diffused into the copper plates 131A and 132A and severity of soft etching. That is, determination is made considering that, with increasing amount of silver diffused into the copper plates 131A and 132A, the concentration of silver contained in the copper plates 131A and 132A increases, the distance by which silver is diffused into the copper plates 131A and 132A increases, the flared portion 1400 is more likely to be formed, and the formed flared portion 1400 is more likely to have the shape illustrated in FIG. 3. Determination is made also considering that, with increasing severity of soft etching, the flared portion 1400 is more likely to be formed, and the formed flared portion 1400 is more likely to have the shape illustrated in FIG. 3.

An increase in amount of silver diffused into the copper plates 131A and 132A can be achieved by an increase in thickness of the brazing material layers 171 and 172, an increase in concentration of silver contained in the active metal brazing material, an increase in temperature when the intermediate product 100A is thermally treated, and the like.

An increase in severity of soft etching can be achieved by an increase in temperature of the etchant used in soft etching, an increase in concentration of iron chloride, copper chloride, and the like contained in the etchant used in soft etching, an increase in time of contact of the copper plates 131C and 132C with the etchant used in soft etching, and the like.

10 Examples

In Examples 1 to 23, bonded substrates 100 were manufactured in accordance with the above-mentioned method of manufacturing the bonded substrate 100.

In each of Examples 1 to 23, the copper plates 131 and 132 each having a thickness of 0.8 mm were bonded to the silicon nitride ceramic substrate 110 having a thickness of 0.32 mm. The brazing material layers 171 and 172 each having a thickness of 0.1 μm or more and 5 μm or less and containing an active metal brazing material containing silver of 40 wt % or more and 80 wt % or less and a titanium hydride were formed. The intermediate product 100A was hot pressed. In this case, the intermediate product 100A was pressurized in accordance with a contact pressure profile having a maximum contact pressure of 20 MPa, and was heated in accordance with a temperature profile having a maximum temperature of 815° C. or more and 845° C. or less in a vacuum. Hard etching was performed by spraying an etchant at a temperature of approximately 45° C. onto the intermediate product 100B. Soft etching was performed by immersing the intermediate product 100C in an iron chloride aqueous solution as the etchant at a temperature of approximately 20° C. for 1.5 min. or more and 5 min. or less. The distance L1 was set to 100 μm or less.

In Comparative Example 1, a bonded substrate 100 was manufactured similarly to those in Examples 1 to 23 except that soft etching was not performed.

In Comparative Examples 2 to 4, bonded substrates 100 were manufactured similarly to those in Examples 1 to 23 except that the brazing material layers 171 and 172 each having a thickness of 0.1 μm or more and 1 μm or less and containing an active metal brazing material containing silver of 40 wt % or less and a titanium hydride were formed, the intermediate product 100A was heated in accordance with a temperature profile having a maximum temperature of 800° C. or less, and soft etching was performed by immersing the intermediate product 100C in an iron chloride aqueous solution as the etchant for 0.5 min. or more and 1 min. or less.

In Comparative Example 5, a bonded substrate 100 was manufactured similarly to those in Examples 1 to 23 except that the brazing material layers 171 and 172 each having a thickness of 5 μm or less and containing an active metal brazing material containing silver of 60 wt % or more and 80 wt % or less and a titanium hydride were formed, the intermediate product 100A was heated in accordance with a temperature profile having a maximum temperature of 900° C. or more, and soft etching was performed by immersing the intermediate product 100C in an iron chloride aqueous solution as the etchant for 1.5 min.

In Comparative Examples 6 and 7, bonded substrates 100 were manufactured similarly to those in Examples 1 to 23 except that a copper plate having a flared portion having a predetermined shape obtained by cutting an end surface of a copper plate was used as each of the copper plates 131A and 132A disposed on the brazing material layers 171 and 172, and hard etching and soft etching were not performed.

In Comparative Example 8, a bonded substrate 100 was manufactured similarly to those in Examples 1 to 23 except that soft etching was performed by immersing the intermediate product 100C in the etchant for 0.5 min. or less.

Each of the manufactured bonded substrates 100 was processed to expose a cross section of the bonded substrate 100, and the exposed cross section was observed under a scanning electron microscope (SEM) to obtain an SEM image. The angles θ1, θ2, and θ3 and the distance L2 were identified from the obtained SEM image. The results are shown in Tables 1 and 2.

In addition, first thermal cycling durability of each of the manufactured bonded substrates 100 was evaluated. In evaluating the first thermal cycling durability, the bonded substrate 100 was subjected to thermal cycling of 3000 cycles. In each cycle, the bonded substrate 100 was sequentially subjected to a low temperature of −40° C. and a high temperature of 150° C. The results are shown in Tables 1 and 2.

In addition, second thermal cycling durability of each of the manufactured bonded substrates 100 was evaluated. In evaluating the second thermal cycling durability, the bonded substrate 100 was subjected to thermal cycling of 3000 cycles. In each cycle, the bonded substrate 100 was sequentially subjected to a low temperature of −55° C. and a high temperature of 175° C. The results are shown in Tables 1 and 2.

In each of Tables 1 and 2, "OK" indicates that it was confirmed in an ultrasonic test that, after the bonded substrate 100 was subjected to thermal cycling of 3000 cycles, the copper plates 131 and 132 were not separated from the silicon nitride ceramic substrate 110, and cracking of the silicon nitride ceramic substrate 110 did not occur. In each of Tables 1 and 2, "NG" indicates the opposite.

FIGS. 11, 12, 13, 14, and 15 respectively show SEM images of cross sections of bonded substrates 100 manufactured in Examples 3, 4, 15, and 16 and Comparative Example 2. Distances L1 were 40 μm (FIG. 11), 30 μm (FIG. 12), 50 μm (FIG. 13), 41 μm (FIG. 14), and 49 μm (FIG. 15) in Examples 3, 4, 15, and 16 and Comparative Example 2, respectively.

TABLE 1

| | θ1 (°) | θ2 (°) | θ3 (°) | L2 (μm) | FIRST THERMAL CYCLING DURABILITY −40° C./150° C. 3000 CYCLES OK/NG | SECOND THERMAL CYCLING DURABILITY −55° C./175° C. 3000 CYCLES OK/NG |
|---|---|---|---|---|---|---|
| EXAMPLE 1 | 165 | — | 122 | 10.5 | OK | NG |
| EXAMPLE 2 | 135 | — | 117 | 35 | OK | NG |

TABLE 1-continued

|  | θ1 (°) | θ2 (°) | θ3 (°) | L2 (μm) | FIRST THERMAL CYCLING DURABILITY −40° C./150° C. 3000 CYCLES OK/NG | SECOND THERMAL CYCLING DURABILITY −55° C./175° C. 3000 CYCLES OK/NG |
|---|---|---|---|---|---|---|
| EXAMPLE 3 | 155 | 163 | 132 | 20.4 | OK | OK |
| EXAMPLE 4 | 160 | 165 | 131 | 13.1 | OK | OK |
| EXAMPLE 5 | 150 | 150 | 125 | 10.3 | OK | OK |
| EXAMPLE 6 | 155 | 165 | 125 | 27.6 | OK | OK |
| EXAMPLE 7 | 139 | 135 | 138 | 10.8 | OK | OK |
| EXAMPLE 8 | 135 | 135 | 127 | 30.7 | OK | OK |
| EXAMPLE 9 | 139 | 155 | 133 | 10.4 | OK | OK |
| EXAMPLE 10 | 135 | 165 | 133 | 30.9 | OK | OK |
| EXAMPLE 11 | 165 | 135 | 130 | 10.2 | OK | OK |
| EXAMPLE 12 | 165 | 145 | 138 | 29.7 | OK | OK |
| EXAMPLE 13 | 165 | 165 | 122 | 10.3 | OK | OK |
| EXAMPLE 14 | 165 | 165 | 141 | 29.6 | OK | OK |
| EXAMPLE 15 | 162 | 165 | 136 | 35 | OK | OK |
| EXAMPLE 16 | 136 | 151 | 128 | 39 | OK | OK |
| EXAMPLE 17 | 127 | 135 | 127 | 58 | OK | OK |
| EXAMPLE 18 | 138 | — | 141 | 30 | OK | NG |
| EXAMPLE 19 | 148 | — | 124 | 25 | OK | NG |
| EXAMPLE 20 | 153 | — | 141 | 15 | OK | NG |
| EXAMPLE 21 | 162 | — | 113 | 10.2 | OK | NG |
| EXAMPLE 22 | 140 | 155 | 110 | 31.9 | OK | OK |
| EXAMPLE 23 | 160 | 163 | 145 | 34.1 | OK | OK |

TABLE 1

|  | θ1 (°) | θ2 (°) | θ3 (°) | L2 (μm) | FIRST THERMAL CYCLING DURABILITY −40° C./150° C. 3000 CYCLES OK/NG | SECOND THERMAL CYCLING DURABILITY −55° C./175° C. 3000 CYCLES OK/NG |
|---|---|---|---|---|---|---|
| COMPARATIVE EXAMPLE 1 | — | — | 130 | — | NG | NG |
| COMPARATIVE EXAMPLE 2 | 165 | 165 | 137 | 9 | NG | NG |
| COMPARATIVE EXAMPLE 3 | 170 | 175 | 131 | 5 | NG | NG |
| COMPARATIVE EXAMPLE 4 | 170 | 170 | 130 | 15 | NG | NG |
| COMPARATIVE EXAMPLE 5 | 133 | 131 | 125 | 9 | NG | NG |
| COMPARATIVE EXAMPLE 6 | 135 | — | 90 | 30 | NG | NG |
| COMPARATIVE EXAMPLE 7 | 108 | — | 90 | 70 | NG | NG |
| COMPARATIVE EXAMPLE 8 | 176 | — | 150 | 10 | NG | NG |

It can be understood from Table 1 that the first thermal cycling durability is "OK", but the second thermal cycling durability is "NG" in Examples 1 to 2 and 18 to 21 in each of which the flared portion 1400 has the shape illustrated in FIG. 2, the angle θ1 is 135° or more and 165° or less, the angle θ3 is 110° or more and 145° or less, and the distance L2 is 10 μm or more.

It can also be understood from Table 1 and SEM images that the first thermal cycling durability and the second thermal cycling durability are each "OK" in Examples 3 to 16 and 22 to 23 in each of which the flared portion 1400 has the shape illustrated in FIG. 3, the angles θ1 and θ2 are each 135° or more and 165° or less, the angle θ3 is 110° or more and 145° or less, and the distance L2 is 10 μm or more.

It can also be understood from Table 1 and an SEM image that the first thermal cycling durability and the second thermal cycling durability are each "NG" in Comparative Example 1 in which the flared portion 1400 does not have the shape illustrated in FIG. 2 or 3.

It can also be understood from Table 1 and an SEM image that the first thermal cycling durability and the second thermal cycling durability are each "NG" in Comparative Example 2 in which the flared portion 1400 has the shape illustrated in FIG. 3, and the angles θ1 and θ2 are each 135° or more and 165° or less, but the distance L2 is less than 10 μm.

It can also be understood from Table 1 and an SEM image that the first thermal cycling durability and the second thermal cycling durability are each "NG" in Comparative Example 3 in which the flared portion 1400 has the shape illustrated in FIG. 3, but the angles θ1 and θ2 are each more than 165°, and the distance L2 is less than 10 μm.

It can also be understood from Table 1 and an SEM image that the first thermal cycling durability and the second thermal cycling durability are each "NG" in Comparative Example 4 in which the flared portion 1400 has the shape illustrated in FIG. 3, and the distance L2 is 10 µm or more, but the angles θ1 and θ2 are each more than 165°.

It can also be understood from Table 1 and an SEM image that the first thermal cycling durability and the second thermal cycling durability are each "NG" in Comparative Example 5 in which the flared portion 1400 has the shape illustrated in FIG. 3, but the angles θ1 and θ2 are each less than 135°, and the distance L2 is less than 10 µm.

It can also be understood from Table 1 that the first thermal cycling durability and the second thermal cycling durability are each "NG" in Comparative Example 6 in which the flared portion 1400 has the shape illustrated in FIG. 2, the angle θ1 is 135° or more and 165° or less, and the distance L2 is 10 µm or more, but the angle θ3 is less than 110°.

It can also be understood from Table 1 that the first thermal cycling durability and the second thermal cycling durability are each "NG" in Comparative Example 7 in which the flared portion 1400 has the shape illustrated in FIG. 2, and the distance L2 is 10 µm or more, but the angle θ1 is less than 135°, and the angle θ3 is less than 110°.

It can also be understood from Table 1 that the first thermal cycling durability and the second thermal cycling durability are each "NG" in Comparative Example 8 in which the flared portion 1400 has the shape illustrated in FIG. 2, and the distance L2 is 10 µm or more, but the angle θ1 is more than 165°, and the angle θ3 is more than 145°.

While the invention has been described in detail, the foregoing description is in all aspects illustrative and not restrictive. It is therefore understood that numerous unillustrated modifications can be devised without departing from the scope of the invention.

What is claimed is:

1. A bonded substrate comprising:
   a silicon nitride ceramic substrate;
   a bonding layer disposed over the silicon nitride ceramic substrate; and
   a copper plate disposed over the silicon nitride ceramic substrate, and having a first main surface, a second main surface, and an end surface, the second main surface being opposite the first main surface and bonded to the silicon nitride ceramic substrate by the bonding layer, the end surface extending from the first main surface to the second main surface, wherein
   the end surface includes:
      a first portion; and
      a second portion closer to the second main surface than the first portion is,
   the first portion and the second portion form an angle of 135° or more and 165° or less on an outside of the copper plate,
   an extended plane of the first portion and the second main surface form an angle of 110° or more and 145° or less on a side where the second portion is located,
   a distance from the second main surface to an intersection of the first portion and the second portion in a direction of a thickness of the copper plate is 10 µm or more and 100 µm or less, and
   the second main surface extends beyond the extended plane of the first portion by a distance of 10 µm or more.

2. The bonded substrate according to claim 1, wherein the end surface further includes a third portion closer to the second main surface than the second portion is, and the second portion and the third portion form an angle of 135° or more and 165° or less on an inside of the copper plate.

3. The bonded substrate according to claim 1, wherein the copper plate includes:
   a first thickness-direction region having the second portion, containing silver, and having a first silver concentration; and
   a second thickness-direction region having the first portion, and having a second silver concentration lower than the first silver concentration.

4. The bonded substrate according to claim 1, wherein the bonding layer includes:
   an interplate portion between the silicon nitride ceramic substrate and the copper plate; and
   an protruding portion protruding from between the silicon nitride ceramic substrate and the copper plate.

5. The bonded substrate according to claim 1, wherein the copper plate has a thickness of 0.5 mm or more.

6. A bonded substrate manufacturing method comprising:
   a) forming, on a silicon nitride ceramic substrate, a brazing material layer containing an active metal brazing material and having a thickness of 0.1 µm or more and 10 µm or less, the active metal brazing material including metal powder containing silver and at least one metal hydride powder selected from the group consisting of titanium hydride powder and zirconium hydride powder;
   b) disposing a copper plate on the brazing material layer to obtain an intermediate product including the silicon nitride ceramic substrate, the brazing material layer, and the copper plate;
   c) thermally treating the intermediate product to change the brazing material layer into a bonding layer to bond the copper plate to the silicon nitride ceramic substrate, and diffusing silver contained in the brazing material layer into the copper plate to form, in the copper plate, a first thickness-direction region containing silver and having a first silver concentration and a second thickness-direction region having a second silver concentration lower than the first silver concentration; and
   d) etching the first thickness-direction region at a first etching rate, and etching the second thickness-direction region at a second etching rate faster than the first etching rate.

7. The bonded substrate according to claim 2, wherein the copper plate includes:
   a first thickness-direction region having the second portion, containing silver, and having a first silver concentration; and
   a second thickness-direction region having the first portion, and having a second silver concentration lower than the first silver concentration.

8. The bonded substrate according to claim 2, wherein the bonding layer includes:
   an interplate portion between the silicon nitride ceramic substrate and the copper plate; and
   an protruding portion protruding from between the silicon nitride ceramic substrate and the copper plate.

9. The bonded substrate according to claim 3, wherein the bonding layer includes:
   an interplate portion between the silicon nitride ceramic substrate and the copper plate; and
   an protruding portion protruding from between the silicon nitride ceramic substrate and the copper plate.

10. The bonded substrate according to claim 7, wherein the bonding layer includes:
- an interplate portion between the silicon nitride ceramic substrate and the copper plate; and
- an protruding portion protruding from between the silicon nitride ceramic substrate and the copper plate.

11. The bonded substrate according to claim 2, wherein the copper plate has a thickness of 0.5 mm or more.

12. The bonded substrate according to claim 3, wherein the copper plate has a thickness of 0.5 mm or more.

13. The bonded substrate according to claim 4, wherein the copper plate has a thickness of 0.5 mm or more.

14. The bonded substrate according to claim 7, wherein the copper plate has a thickness of 0.5 mm or more.

15. The bonded substrate according to claim 8, wherein the copper plate has a thickness of 0.5 mm or more.

16. The bonded substrate according to claim 9, wherein the copper plate has a thickness of 0.5 mm or more.

17. The bonded substrate according to claim 10, wherein the copper plate has a thickness of 0.5 mm or more.

\* \* \* \* \*